(12) United States Patent
Statham et al.

(10) Patent No.: US 11,195,692 B2
(45) Date of Patent: Dec. 7, 2021

(54) SYSTEM FOR ELECTRON DIFFRACTION ANALYSIS

(71) Applicant: OXFORD INSTRUMENTS NANOTECHNOLOGY TOOLS LIMITED, Abingdon (GB)

(72) Inventors: Peter Statham, Abingdon (GB); Angus Bewick, Abindgon (GB)

(73) Assignee: OXFORD INSTRUMENTS NANOTECHNOLOGY TOOLS LIMITED, Oxon (GB)

( * ) Notice: Subject to any disclaimer, the term of this patent is extended or adjusted under 35 U.S.C. 154(b) by 0 days.

(21) Appl. No.: 16/646,502

(22) PCT Filed: Sep. 28, 2018

(86) PCT No.: PCT/GB2018/052766
§ 371 (c)(1),
(2) Date: Mar. 11, 2020

(87) PCT Pub. No.: WO2019/064013
PCT Pub. Date: Apr. 4, 2019

(65) Prior Publication Data
US 2020/0273663 A1    Aug. 27, 2020

(30) Foreign Application Priority Data

Sep. 29, 2017   (GB) ..................... 1715902

(51) Int. Cl.
*H01J 37/244* (2006.01)
*H01J 37/26* (2006.01)
(Continued)

(52) U.S. Cl.
CPC .......... *H01J 37/244* (2013.01); *H01J 37/222* (2013.01); *H01J 37/265* (2013.01); *H01J 37/295* (2013.01);
(Continued)

(58) Field of Classification Search
CPC ........... G01N 21/95607; G01N 15/147; G01N 2021/4707; G01N 21/47; G01N 21/4738;
(Continued)

(56) References Cited

U.S. PATENT DOCUMENTS 5,199,054 A * 3/1993 Adams ................. G01R 31/302
378/21
10,014,158 B1 * 7/2018 Janssen .................... H01J 37/26
(Continued)

OTHER PUBLICATIONS

Small et al., "Phase identification of individual crystalline particles by electron backscatter diffraction", Journal of Microscopy, vol. 201, Pt 1, 2001, pp. 59-69.
(Continued)

*Primary Examiner* — David A Vanore
(74) *Attorney, Agent, or Firm* — Blank Rome LLP

(57) ABSTRACT

A method and system for processing a diffraction pattern image obtained in an electron microscope are disclosed. The method comprises, according to a first set of microscope conditions, causing an electron beam to impinge upon a calibration specimen so as to cause resulting electrons to be emitted therefrom and monitoring the resulting electrons using a detector device so as to obtain a calibration image comprising a plurality of pixels having values, the first set of microscope conditions being configured such that the calibration image includes substantially no electron diffraction pattern; obtaining, from the calibration image, a gain variation image comprising a plurality of pixels, each having a value representing relative detector device gain for a corresponding pixel of the calibration image; according to a second set of microscope conditions, causing an electron beam to impinge upon a target specimen so as to cause resulting electrons to be emitted therefrom and monitoring the resulting electrons using the detector device so as to obtain a target image comprising a plurality of pixels having
(Continued)

values, the second set of microscope conditions being configured such that the target image includes an electron diffraction pattern; and for each pixel of the target image, removing from the pixel value, in accordance with the value of the corresponding pixel of the gain variation image, the contribution to the pixel value of the relative detector device gain, so as to obtain a gain variation-corrected image.

19 Claims, 9 Drawing Sheets

(51) Int. Cl.
   *H01J 37/22* (2006.01)
   *H01J 37/295* (2006.01)
(52) U.S. Cl.
   CPC ... *H01J 2237/221* (2013.01); *H01J 2237/226* (2013.01); *H01J 2237/24475* (2013.01)
(58) Field of Classification Search
   CPC .......... G01N 21/6428; G01N 21/6452; G01N 21/6456; G01N 21/8806; G01N 21/94; G01N 2223/104; G01N 2223/316; G01N 2223/418; G01N 23/043; G01N 23/044; G01N 23/207; G01N 23/2251; G01N 21/9501; G01N 21/253; G06T 2207/10061; H01J 37/244; H01J 37/222; H01J 37/265; H01J 37/295; H01J 2237/221; H01J 2237/226; H01J 2237/24475
   USPC ........................................ 250/309, 310, 397
   See application file for complete search history.

(56) References Cited

U.S. PATENT DOCUMENTS

| | | | |
|---|---|---|---|
| 2002/0186874 A1* | 12/2002 | Price | G06T 7/11 382/133 |
| 2003/0153023 A1* | 8/2003 | Starzl | G01N 21/47 435/7.92 |
| 2004/0178351 A1* | 9/2004 | Kim | G01N 21/8806 250/372 |
| 2009/0226075 A1* | 9/2009 | Hiroi | G01N 21/95607 382/149 |
| 2010/0237242 A1* | 9/2010 | Schwarzer | G01N 23/207 250/309 |
| 2011/0129141 A1* | 6/2011 | Hiroi | G01N 21/95607 382/149 |
| 2011/0141272 A1* | 6/2011 | Uto | G01N 21/9501 348/135 |
| 2018/0054575 A1* | 2/2018 | Pawlowicz | G01N 23/2251 |
| 2019/0026879 A1* | 1/2019 | Batikoff | G06T 5/50 |

OTHER PUBLICATIONS

Philpott et al., "The application of line imaging velocimetry to provide high resolution spatially resolved velocity data in plate impact experiments", Meas. Sci. Technol. Vol. 26, 2015, pp. 1-13.
Sitzman, "Introduction to EBSD analysis of micro- to nanoscale microstructures in metals and ceramics", Proceedings of Spie, vol. 5392, 2004, pp. 78-90.
International Search Report of International Application No. PCT/GB2018/052766.

* cited by examiner

SYSTEM FOR ELECTRON DIFFRACTION ANALYSIS

RELATED APPLICATIONS

This application is a U.S. National Stage Application of International Application No. PCT/GB2018/052766, filed on Sep. 28, 2018, which claims priority of Great Britain Application No. 1715902.1, filed on Sep. 29, 2017. The entire contents of those applications are incorporated herein by reference.

FIELD OF INVENTION

The present invention relates to a system and method for improving the sensitivity of electron diffraction pattern analysis in an electron microscope and in particular analysis of Kikuchi patterns.

BACKGROUND TO THE INVENTION

FIG. 1 is a schematic showing some parts of a system that are employed in a scanning electron microscope (SEM) for exploring the surface of a specimen. The electron beam, with typical energy between 5 keV and 30 keV, is produced inside an evacuated chamber and usually focused with a combination of magnetic lenses within the "SEM column" 101. When the focused beam 105 strikes a specimen 107, some electrons are scattered back from the specimen (backscattered electrons or BSE). For the last 30 years, systems have been commercially available for detecting the Kikuchi band patterns that are caused by diffraction of the emerging backscattered electrons, sometimes called "electron backscatter diffraction patterns" or EBSD patterns. These systems typically comprise a sensitive camera that records the optical image produced when backscattered electrons strike a phosphor. FIG. 1 shows a typical arrangement wherein a specimen is supported on a special tilt holder on the SEM stage 109 and the EBSD camera 103 is inserted through a port on the SEM vacuum chamber so that the phosphor is positioned close to the specimen, where it will be hit by a diverging beam of electrons backscattered from a point on the sloping specimen surface. FIG. 2 shows an expanded view, in which like features are indicated by like reference numerals, where the position of the electron-sensitive camera surface is shown near to a tilted specimen surface on a holder 208. The SEM final lens pole piece 213 is shown, along with an x-ray detector tube 215 with an x-ray collimator and electron trap 217. The sensitive front surface of the EBSD camera system is shown at 219.

The angular modulation of intensity caused by diffraction effects on backscattered electrons rides upon the general angular intensity distribution of diffuse backscattering from a point on the sample. At the high tilt angle of 70° typically required for optimizing diffraction contrast, the angular distribution of backscattering in the vertical direction (parallel to the beam) is highly peaked in the forward scattering direction, approximately around the specular reflection condition for the incident beam. Consequently, the dynamic signal range due to diffuse backscattering is usually much greater than the intensity variations associated with the relatively weak Kikuchi pattern contrast due to crystallographic diffraction.

An alternative geometry configuration uses a thin specimen that is supported so that the focused electron beam, typically 20-30 keV in energy, is transmitted through the specimen and the camera phosphor is placed below the specimen so that electrons scattered from beneath the specimen strike the phosphor and form an image that contains a "transmitted electron Kikuchi pattern" or TKD pattern. As with EBSD, the TKD pattern modulation due to crystallographic diffraction represents a small fraction of the large background due to diffuse scattering of electrons.

In order to improve detection of the small contrast (typically a few percent) due to Kikuchi diffraction, a correction is required for the large variation in the background signal due to diffuse scattering. J. A. Small and J. R. Michael (Journal of Microscopy, Vol. 201, Pt 1, January 2001, pp. 59-69) used a 1024×1024 CCD camera directly coupled by fibre optic reducer to a phosphor screen for detecting the electron distribution emanating from the specimen. To correct for the background variation, the authors applied a "flat-fielding" correction to the acquired image by dividing it, on a pixel-by-pixel basis, by a reference image obtained from an amorphous material with the same average atomic number that showed a similar diffuse background but without any diffraction contrast. Provided the sample composition (which affects the diffuse backscattering) and the position relative to the incident beam and the camera were maintained constant, the authors could use the same reference image for an entire sample or sample set. However, when analysing particles rather than a flat sample, Small and Michael note that the angular distribution of the diffuse background depends on the local geometry of incidence on the particle and the greater the difference between the angular distribution of the background and particle EBSD pattern images, the less effective the flat-fielding procedure and the lower the quality of the corrected EBSD pattern. They therefore decided to obtain background images by scanning the beam over features where the crystallographic contrast is randomized, for example by scanning the beam over an area of the particle where there was a fracture exposing several surfaces with multiple orientations relative to the camera face. Nevertheless, the authors acknowledge that the selection of the exact measurement location for the background and the EBSD image to minimize the difference in angular distributions of the backscattered electrons can dramatically affect the success rate for successful analysis of single particles, particularly those less than a micrometre in size.

The technical issues involved in measuring weak diffraction pattern contrast on a large diffuse background signal may be understood with the following representation. A pattern recorded on an electron-sensitive camera system can be represented as a digital image which consists of a number of pixels (e.g. an image represented by a 2D array of 1000×1000 would consist of 1 million pixels) where the position of a single pixel can be referenced by an index J. The intensity in the observed image at pixel J can be represented approximately as follows:

$$Y(J)=(B(J)*D(J))*G(J)+N(J)$$

When the incident beam is switched on, a broad background of diffusely scattered electrons, B(J), is produced towards the camera and modulated by diffraction effects, D(J), in the specimen. Both B(J) and D(J) are affected by a number of factors such as distance from specimen to camera and position and orientation of phosphor screen, incident electron beam energy, specimen material, specimen crystallographic orientation and specimen tilt angle. The scattered electrons then strike the camera, which typically comprises several elements: a phosphor-coated screen (which converts the electron signal into a light signal); an optical coupling; and a digital image sensor 322 (see FIG. 3). In FIG. 3 the optical coupling is achieved with a single, optical fibre imaging bundle 320. Some cameras use two or more such fibre bundles in series, or use a lens instead of optical fibre bundles. Some cameras do not use either a phosphor or an optical coupling; in this case, the sensor itself is the screen, and these cameras are sometimes referred to as "Direct Electron Detectors".

The phosphor screen disposed in the form of powder on the fibre optic bundle is shown at 324. Electrons from the incident beam 305 interact with the specimen 307 and resulting scattered electrons 326 incident upon the phosphor screen 324 can be detected. The signal level output from the sensor at pixel J for each electron reaching the camera screen at pixel J depends on a number of factors such as the efficiency of light production at the phosphor, the efficiency of light coupling to the sensor, the efficiency of signal production at the sensor and the electronic gain at the sensor. These efficiencies and gains are all subject to variation from pixel to pixel. In particular, for optical systems, there is variation in the screen owing to variation in the phosphor, and in fibre optic systems the regular spacing of fibre walls can give rise to so-called "chicken wire" patterning, or moiré interference patterns between stacked fibre optic elements or between the final fibre optic element and the image sensor. This variation in camera system gain, G(J), can be very high compared with the variation in diffraction factor, D(J) which is of primary interest.

When the incident beam is switched off, B(J)=0 but a weak image, N(J), is still observed due to dark current in the digital image sensor and this image may show structure sometimes referred to as "dark fixed pattern noise".

If an image is recorded with the beam off using the same acquire time, the dark fixed pattern noise, N(J) can be determined and this can be subtracted from images obtained with the beam on so that the corrected image is B(J)*D(J)) *G(J). If an image is recorded under identical geometry and beam conditions from an amorphous reference material with the same mean atomic number as the specimen, after correction for dark fixed pattern noise, the reference image will be B(J)*G(J) because there is no modulation due to diffraction effects. Therefore, if the corrected specimen image is divided by the corrected reference image, as suggested by Small and Michael, the result will be D(J), which represents the modulation due to diffraction effects alone. However, if the reference image is obtained with a specimen with different atomic number, or the geometry of incident beam, specimen and camera is different, or the incident electron beam energy is different, then the corrected image from the reference will be B'(J) and the result of dividing the corrected specimen image by the corrected reference image will be D(J)*(B(J)/B'(J)). The factor (B(J)/B'(J)), which is due to variations in diffuse electron scattering between specimen and reference, may therefore seriously affect the success rate for analysis of Kikuchi diffraction pattern contrast D(J).

The practical difficulty of obtaining a suitable reference image, or "static background" for "flat fielding" can be overcome by using "dynamic background correction" as suggested for example by Dingley et al. (Microsc Microanal 11(Suppl 2), 2005). In this case, the reference background pattern used in the flat-fielding procedure is formed from the specimen pattern itself. This is done by blurring the pattern using a relatively large radius Gaussian convolution mask. This method depends on the fact that the diffuse background is a slowly-varying function of angle giving low spatial frequencies in the image whereas the diffraction modulation gives much higher spatial frequency content in the image. Therefore, if the image is subjected to a digital low-pass filter, or the convolution equivalent such as convolving with a Gaussian where the width of the Gaussian is much greater than the typical period of diffraction contrast fluctuations, the diffraction contrast is strongly attenuated and the result is close to the required diffuse background B(J). Dingley et al. point out that dynamic background correction has a few drawbacks over the conventional "static background correction" approach because any defects in the phosphor screen (such as scratches or pores, or the small-scale granular texture inherent to phosphor screens) are not removed using the dynamic approach whereas the static background approach is very effective at removing them. Most of the published results to date that show EBSD or TKD have been obtained with camera systems that use a phosphor, conventional optical lenses, and a charge coupled device (CCD) image sensor. With this arrangement, the camera system pixel gain variation, G(J), is dominated by the phosphor structure which remains poorly corrected by the dynamic background method.

Greater efficiency of light coupling and increased imaging speed can be achieved through use of fibre optic coupling and use of CMOS image sensor technology. However, due to the method of read-out of CMOS image pixels, the CMOS sensor image often exhibits fixed pattern artefacts such as line noise and the combination of a patterned fibre optic and a CMOS image sensor typically results in a pixel gain variation, G(J), that shows high contrast at high spatial frequencies and thus interferes with detection of the contrast of real interest, D(J). As discussed above, the static background approach can be used to correct for these pixel gain variations but requires an appropriate reference specimen and careful control of acquisition of the reference image which is inconvenient and requires skill. Furthermore, if the specimen has phases with different atomic number, then a single static background reference cannot be used for correcting patterns from all over the specimen. If the alternative, dynamic background correction approach is used, the contribution from dark fixed pattern noise can be subtracted to give a dark pattern-corrected image B(J)*D(J))*G(J) and a low-pass filter applied to remove high-frequency detail to give a reference that approximates B(J), and when this is divided into the dark pattern corrected image, the result is approximately D(J)*G(J). Therefore, when dynamic background correction is used, the high-frequency detail due to pixel gain variations interferes with the high-frequency detail that defines the diffraction contrast so neither conventional static or dynamic background correction provides an effective solution when there is substantial variation in effective pixel gain.

What is needed for Kikuchi diffraction analysis is an approach to background correction that does not require multiple reference background images to be acquired and gives a result where the diffraction contrast is not corrupted by camera system pixel gain variations.

SUMMARY OF THE INVENTION

In accordance with a first aspect of the invention there is provided a method of processing a diffraction pattern image obtained in an electron microscope, the method comprising: according to a first set of microscope conditions, causing an electron beam to impinge upon a calibration specimen so as to cause resulting electrons to be emitted therefrom and monitoring the resulting electrons using a detector device so as to obtain a calibration image comprising a plurality of pixels having values, the first set of microscope conditions being configured such that the calibration image includes substantially no electron diffraction pattern; obtaining, from the calibration image, a gain variation image comprising a plurality of pixels, each having a value representing relative detector device gain for a corresponding pixel of the calibration image; according to a second set of microscope conditions, causing an electron beam to impinge upon a target specimen so as to cause resulting electrons to be emitted therefrom and monitoring the resulting electrons using the detector device so as to obtain a target image comprising a plurality of pixels having values, the second set of microscope conditions being configured such that the target image includes an electron diffraction pattern; and for each pixel of the target image, removing from the pixel value, in accordance with the value of the corresponding pixel of the gain variation image, the contribution to the pixel value of the relative detector device gain, so as to obtain a gain variation-corrected image.

The inventors have devised an approach to removing pixel gain variations from diffraction pattern images that overcomes the drawbacks of conventional static background correction and dynamic background correction, including obtaining a calibration image that includes substantially no electron diffraction pattern from a calibration specimen, from which an image may be obtained wherein the pixels have values representing relative detector device gain variation for the calibration image, so that the pixel gain variation may be removed from a target image obtained using a target specimen. Advantageously, the method allows an obtained diffraction pattern image to be processed, in particular to have removed from it the variations in pixel values that are due to variations in detector device or camera system pixel gain, without requiring multiple reference images to be obtained and without requiring a reference sample having a particular average atomic number.

For brevity it can be assumed that a correction for dark fixed pattern noise is always applied to any acquired image. Thus the $N(J)$ term is ignored in the following described process. Using the notation above, the specimen image (after correction for dark fixed pattern noise) will thus be represented as $B(J)*D(J)*G(J)$. A calibration image is typically acquired first, and typically from an amorphous reference sample (that may have a different atomic number from the target specimen) using a first set of microscope, "calibration", conditions, MC. Since an amorphous specimen is used, there is no diffraction contrast and the image can be represented as $R(J)=B'(J)*G(J)$. The image is then typically processed using a low-pass filter F1, which attenuates the high spatial frequency modulation that is due to variation in pixel gain $G(J)$, and leaves a result, $R_{F1}(J)$, that is a close estimate of $B'(J)*G_{mean}$, where $G_{mean}$ is a local average of the pixel gain commensurate with the pass band of the filter. The reference image is typically divided by the low-pass filtered image to obtain an estimate of the relative pixel gain $G(J)/G_{mean}$ for every pixel J in the image, which is saved as $g(J)$.

Typically, when any new specimen is analysed under the second set of "specimen" microscope conditions, MS, the scattered electron image is represented by $S(J)=(B(J)*D(J))*G(J)$ and this is divided by the saved image of relative pixel gain, $g(J)$, to give a result $SC(J)=(B(J)*D(J))*G_{mean}$.

The causing of an electron beam to impinge upon a sample is typically performed using an electron microscope. Microscope conditions as referred to in this disclosure may comprise a number of different configurable conditions. Those conditions which may be configured for the electron column of the electron microscope may comprise magnification, focus, astigmatism, accelerating voltage, beam current, and scan deflection. In some embodiments the aforementioned list of microscope conditions may be configured for the electron beam. The geometry under which electrons are monitored for a sample, in particular the position and orientation, may generally be configurable for the specimen, or in particular configured for a specimen stage adapted to hold the specimen. These geometry conditions can include the spatial coordinates, which may include position in the X, Y, and Z axes in a Cartesian coordinate system, as well as degrees of tilt and rotation, of the specimen. Brightness and contrast may in some embodiments be configured for the detector device.

The calibration specimen is typically amorphous. In particular, the calibration specimen, or at least the part of the specimen with which the incident electron beam interacts, or upon which it impinges, is typically amorphous. By causing the electron beam to impinge upon a material that is not crystalline, the calibration image can be caused to lack, or substantially lack, an electron diffraction pattern. Thus the selection of the calibration specimen may be considered as one of the first set of microscope conditions, in that the selection of an amorphous calibration specimen may result in the first set of microscope conditions being configured such that the calibration image includes substantially no electron diffraction pattern.

The obtained calibration image may be represented by $B'(J)*G(J)$, using the same notation as above.

As noted above, the calibration image comprises a plurality of pixels having values. A pixel value as referred to in this disclosure is typically a number associated with a pixel. The value typically represents the brightness of, or amount of intensity at, the pixel. For example, a pixel may have, or may have associated with it, a number representing the intensity or count of electrons received at an element of the detector device corresponding to that pixel.

The configuring of a set of microscope conditions may comprise those microscope conditions being predetermined. In this way the conditions may be established or selected in advance of performing the steps to acquire the calibration image.

The configuring of the conditions such that the calibration image includes substantially no electron diffraction pattern may be understood as configuring those conditions such that no diffraction pattern is present in resulting electrons exiting the calibration specimen, for example by virtue of the calibration sample being amorphous, as discussed above. The lack of a diffraction pattern, which may be observed as the lack of any annular variation in the intensity of emitted electrons from the calibration sample owing to electron diffraction, may be achieved in a number of different ways, and by way of various configured first sets of microscope conditions. Preferably, the calibration image includes no electron diffraction pattern. In the context of the calibration image itself, an electron diffraction pattern may be understood as the variation in pixel values that is caused by the diffraction of electrons by the calibration specimen. Thus, the calibration image, or the pattern therein, typically includes no component that is caused by or attributable to such electron diffraction.

The gain variation image may be thought of as $g(J)$ using the above-established notation, or as an estimate or an approximation of $g(J)$.

As noted above, each of the plurality of pixels comprised by the gain variation image has a value representing relative detector device gain for a corresponding pixel of the calibration image. This may be understood as each pixel having a calculated value, or an estimated or approximated value, for the relative detector device gain at that pixel, or the corresponding element, in the detector. The term "approximated" as used here does not exclude the approximated value being an accurate value that is exactly equal to the actual relative gain. However, in practice, it is typical that the approximated value is a close estimate of the actual relative gain for that pixel or detector element.

The relative detector device gain may be understood as the variation of detector device gain between different pixels or corresponding elements of the detector. Generally, the relative detector device gain may be understood as the difference or ratio, for each pixel, between the gain value for that pixel and an average gain value for multiple or all of the plurality of pixels. Typically, the relative gain value can represent the individual variation or quantitative relation between the gain value for that pixel and an average gain value. The average gain value may be the same for all pixels, or it may vary across the image. For example, a varying average may be obtained when the average value is calculated by applying a smoothing function, or a low-pass filter for example to the calibration image so as to blur or smooth variations in pixel value that are attributable to detector device gain.

As noted earlier, the relative detector device gain for a pixel may be influenced or determined by a number of factors. These variations, between pixels, in the detector device gain, that may be understood as the factor of output voltage or signal increase for each electron, or for a level of incident electrons, reaching the detector device at a given sensor pixel or sensor or detector element, may be affected by various different detector and pixel properties and conditions. For instance, the detector device gain for a pixel may be different from that for another pixel in the same device because of the efficiency of light production at a phosphor of the detector, the efficiency of light coupling to a sensor, the efficiency of signal production at a sensor, and the electronic gain of the sensor. Thus it will be understood that, in the gain variation image, each pixel may have a value representing a relative detector device gain value, and that it is by virtue of obtaining these values that the method facilitates the removal of unwanted image features arising from these gain variations from images to be analysed.

Each pixel in the gain variation image may be thought of as having a value representing a relative detector device gain at a corresponding pixel of the calibration image. In this sense, the value of a given pixel in the gain variation image typically represents, or provides an indication of, the relative detector device gain that will affect the value of the corresponding pixel in the calibration image, or any other image captured by the detector device in question. A pixel in one image corresponding to a pixel in another image may be understood as those two pixels being located in the same position in their respective images. Pixels corresponding to one another may also be thought of as pixels that share the same value of a reference index, such as (J) as per the notation used above, or the same values of coordinate(s). Thus a pixel in the gain variation image may represent the relative gain at a corresponding pixel of the calibration image, and at a corresponding element of the detector device. The elements or pixels in a detector device, and in particular forming part of the sensor on a detector device, may typically have positions within a plurality or array of sensor elements, and may have reference indices and/or coordinate(s) that are the same as the positions, reference indices, and coordinate(s) in the calibration image, and so also in the other images that form part of this method.

There is typically a one-to-one correspondence between pixels of images involved in the method. In this way, typically, each pixel in each of the calibration image, the gain variation image, the target image, and the gain variation-corrected image typically corresponds to a pixel in each of the other images. Preferably, each pixel in any one of the images corresponds to a single pixel in each of the other images. Correspondence is typically defined by the position of corresponding pixels in different images being the same, and/or by a reference index being common to corresponding pixels in different images. Each element of the detector device typically has a corresponding pixel in each of the obtained images.

In some embodiments, the number of elements of the detector may be different from the number of pixels in an image used in the method. Likewise, obtaining each of the calibration image and the target image may comprise obtaining more pixels than the number of pixels comprised by the respective obtained image. This may be the case, for example, through either or both of the calibration and target images being a sub-image of an image obtained by a detector device. A set of pixels that defines an image is typically defined by a set of pixels in the gain variation image and/or the gain variation-corrected image. For example, the detector device may acquire an image of a given size, or in particular comprising a given number of pixels. If a subset of those pixels were to be used to obtain a gain variation image or a gain variation-corrected image, then, because of the correspondence between pixels of the different images, the obtained target and calibration images would typically be defined by that subset. In preferable embodiments, however, the images obtained by the detector device, and the images involved in the method, are identical in anyone or more of size, resolution, and aspect ratio.

The target specimen upon which the electron beam is caused to impinge in order to obtain the target image typically is, or forms a part of, a specimen or piece of material of interest for which an electron microscopy image, typically an EBSD image, is desired. Since an electron diffraction pattern is required, the target specimen is typically crystalline, or comprises a crystalline region. In some embodiments, the target specimen and the calibration specimen form different parts or regions of the same piece or body of material. In other embodiments the two specimens are separate. The target sample and the calibration sample may have chemical compositions or average atomic numbers that are the same as one another or are different. Thus, advantageously with the present method, there is no particular requirement that the calibration sample have a particular composition. Preferably, any specimen may be used as the calibration specimen if that specimen is suitable for obtaining a calibration image from electrons emitted from the sample when the electron beam is caused to impinge thereupon.

The second set of microscope conditions may be configured, or predetermined, in such a way that electrons from the beam enter the target specimen and are diffracted so as to result in an angular variation in the intensity of emitted resulting electrons.

The obtained target image may be represented, using the previously employed notation, as $B(J)*D(J)*G(J)$. The $D(J)$ term indicates that the diffraction pattern is present in the target image, owing to the angular variation in electron intensity of the resulting emission of electrons from the target specimen. The diffraction pattern may be caused to be present in the resulting electrons for example by virtue of the target sample being crystalline or comprising a crystalline area, and by the beam and microscope geometry. Thus the target image, and in particular the values of the pixels in that image, may include a component or contribution arising from the angularly varying electron intensity due to electrons being diffracted in the target sample. The target image thus typically includes a component of the pattern of the image that is formed by variation of values across the plurality of pixels of the image that arises from electron intensity variation resulting from diffraction. The image, or the pattern therein, may in this way be thought of as including a component caused by or attributable to such diffraction.

Once a target image and a gain variation image have been obtained, it is possible to use the latter to remove unwanted features from the former. Removing, from the value of a pixel of the target image, the contribution to the value of the relative detector device gain typically comprises calculating a ratio of the value of the pixel of the target image and the value of the corresponding pixel of the gain variation image. The procedure thus typically comprises dividing the pixel value of a target image pixel by the relative value of the detector device gain for that pixel. The gain variation component may be removed by way of dividing pixel values because the contribution to the target image of the detector device gain is typically multiplicative, as indicated by the "*G(J)" operation in the above expression describing the target image. In this way, the removal being performed in accordance with the value of the corresponding pixel of the gain variation image preferably means removing the contribution by dividing the target pixel value by the gain variation pixel value.

The contribution that is removed may be thought of as the component or factor contributing to the value of a target image pixel that results from the gain value for that pixel with respect to an average gain value for multiple or all of the plurality of pixels. It will be understood that this contribution may have resulted in the value of a target image pixel value being lower, as well as higher, than it would otherwise be. For example, a pixel in the target image may be caused to be dimmer (have a lower value) or brighter (have a higher value) by the detector device gain for the detector element corresponding to that pixel being lower, or higher, respectively, than an average gain value for the detector or a part thereof. Therefore, dividing the value of that target image pixel by the relatively low, or high, respectively, value of the corresponding pixel of the gain variation image will correct for the gain variation and cause the corresponding pixel in the gain variation-corrected image to lack the dimming/brightening influence of the specific relative gain value for that pixel and thus have a higher or lower value, respectively.

The gain variation-corrected image may therefore be represented by $B(J)*D(J)*G_{mean}$. In this way, small-scale, or high-spatial frequency, non-uniformities in pixel values due to variations in detector device gain may be removed. As indicated by the presence of $G_{mean}$ in the expression for the gain variation-corrected image, a smoothed, blurred, or averaged detector device gain component is still present in the gain variation-corrected image typically. However, because of the removal of the rapidly varying pattern features attributable to variations in device gain between pixels, this remaining component is typically a constant, or slowly varying value across the image. Thus the components that are retained, represented by $G_{mean}$ component that remains, are typically of low spatial frequency, or a spatial frequency less than that of the diffraction pattern bands in the target image. In some embodiments, $G_{mean}$ has a constant value across the image, or, in a mathematical sense, varies with the spatial frequency of zero, which may correspond to a mean average value of the detector device gain for the image.

Once a gain variation-corrected image has been obtained by way of the disclosed method, further analysis can then proceed either with or without further image corrections. In embodiments wherein additional processing is performed, a variety of methods for background correction may be applied to the gain variation-corrected image. In some embodiments, for example, the method further comprises applying a low-pass spatial filter to the gain variation-corrected image so as to obtain a filtered image that includes substantially no electron diffraction pattern. In some of these embodiments, the method also comprises, for each pixel of the gain variation-corrected image, dividing the pixel value by the value of the corresponding pixel of the filtered image so as to obtain a further corrected electron diffraction pattern image. In these cases, the low-pass spatial filter may be configured or predetermined to smooth or average out patterns in an image with spatial frequencies greater than typical or measured spatial frequencies of diffraction pattern bands. The filtered image may be represented by $B(J)*G_{mean}$. This may be considered an appropriate approximation, because the application of the low-pass filter typically results in the contribution to the filtered image of the smoothed electron diffraction pattern contrast being negligible compared to the other terms.

Dividing the pixel value of the gain variation-corrected image by the value of the corresponding pixel of the filtered image thus represents removing the contributions of the diffuse background and the smoothed or averaged gain. As noted above, the contributions of these terms or components are typically multiplicative, and so these parts of the pattern may be removed, or corrected for, by way of dividing pixel values. The resulting electron diffraction pattern image may therefore be thought of as an approximation or estimate of $D(J)$, and thus will exhibit an improved-contrast electron diffraction pattern for the target specimen, with diffuse background and gain variation noise both removed. It will be appreciated, however, that the diffuse background component need not necessarily be removed in order to advantageously correct for the detector device gain pixel variations in accordance with the disclosed method. In this sense, as noted above, this extra background correction is not necessarily required in order to perform analysis on the obtained image. Moreover, several alternative modes of background correction methods are also possible, and the above described procedure is given as an example only.

Returning to the notation with which the method is explained above, this example of additional correction may be thought of as follows.

The relative-pixel-gain-corrected image may be subjected to a low-pass filter F2 that removes the high spatial frequency diffraction contrast to give a "dynamic background estimate" $S_{CF2}(J)=B(J)*G_{mean}$. When $S_C(J)$ is divided by $S_{CF2}(J)$, the result is $K(J)$, which is an estimate of pure diffraction contrast, $D(J)$.

Subsequent analysis of $K(J)$ may be used to detect Kikuchi lines and work out crystallographic properties of the target specimen material, as in conventional EBSD and TKD analysis.

These operations are represented by the flow chart in FIG. 4.

FIG. 4 illustrates a flow chart including operations involved on the Jth pixel of an image. It should be noted that FIG. 4 is provided in order to illustrate an embodiment of the method for the purpose of clarity of explanation. Moreover, as explained previously, steps 6-9 as shown in FIG. 4 correspond to additional background correction steps, and it is typical to perform the method without any such additional processing.

With regard to the gain variation image, this is typically obtained by calculating a value for each pixel thereof from the corresponding pixel of the calibration image obtained from the calibration specimen. Thus, obtaining the value of each pixel of the gain variation image typically comprises calculating an estimate of the relative detector device gain for a corresponding pixel of the calibration image. Obtaining the value of a pixel of the gain variation image may involve assigning the calculated estimate as the pixel value of the gain variation image. The gain variation image pixels may thus have values that are estimates or approximations of g(J). This calculated estimate of the relative detector device gain from a corresponding pixel of the calibration image may be advantageously used to correct any image obtained using that detector device so as to remove the pixel gain variation component.

As shown for the process depicted in FIG. 4, the obtaining of the gain variation image pixel values, in particular the relative gain value calculation, may be performed by a smoothing step and a dividing step. In particular, the obtaining of the gain variation image preferably comprises: applying a first smoothing function to the calibration image so as to obtain a first smoothed image comprising a plurality of pixels corresponding to the plurality of pixels of the calibration image. Typically each pixel has a value comprising an average of the values of a set of pixels including the corresponding pixel of the calibration image. Obtaining the gain variation image typically further comprises, for each pixel of the calibration image, dividing the pixel value by the value of the corresponding pixel of the first smoothed image so as to obtain a calculated value, or an estimate or approximation, for the relative detector device gain for the pixel, or corresponding to, that is applied to that pixel, by the device.

It will be understood that the smoothing function is typically an image processing operation that smooths the pattern or variations in the image according to some parameters. As is known in the art, smoothing an image typically comprises generating an approximating image that attempts to capture larger-scale patterns in the image, while omitting noise or other smaller-scale structures or rapid spatial variations in pixel values. This may be performed by blurring or convolving an image by a smoothing function such as a Gaussian function. The first smoothing function is typically configured to remove high-spatial frequency variations in pixel values or pixel intensities, or is configured to replace each pixel value with an average, for example a mean or median, value for multiple pixels, for instance for that pixel and one or more neighbouring pixels, or weighted averages according to a function. The first smoothing function may be configured to remove or smooth out variations in pixel values that result from variations in detector device gain, and in particular high-spatial frequency variations. Since pixel gain variations are typically higher in their spatial frequencies than contrast patterns or variations arising from other phenomena, such as electron diffraction bands, the first smoothing function may advantageously produce a first smoothed image in which those rapid variations are removed.

The first smoothed image may be represented by B'(J) *$G_{mean}$. Thus the first smoothed image may be thought of as being a product of the diffuse background from the obtaining of the image from the calibration sample and the averaged, smoothed, or blurred pixel gain for all or multiple pixels.

The dividing operation, wherein each pixel of the calibration image has its value divided by the value of the corresponding first smoothed image pixel may be represented by $G(J)/G_{mean}$, since the diffuse background pattern for each of the calibration image and the target image, B'(J) and B(J) respectively, are expected to be, or are approximately, the same. These diffuse background patterns are typically similar enough that dividing one by the other may be considered as effectively removing the diffuse background contribution to the extent that any remaining diffuse background contribution or artefact is negligible or may be ignored for the purposes of the analysis to which the present disclosed method is directed.

A number of different techniques may be utilised for applying the first smoothing function to the calibration image. In some embodiments, the first smoothing function is a first low-pass spatial filter, and the first smoothed image is therefore a first filtered image. In this context, the ordinal "first" is used arbitrarily, and implies no connection to or relationship with any other spatial filters. It will be understood that a low-pass spatial filter is typically a filter or filtering function that passes features of an image, in the sense of variation in pixel values, with a spatial frequency lower than a predetermined cut-off frequency, and attenuates features with spatial frequencies higher than the cut-off frequency. Preferably, the linear scale of the first low-pass filter is greater than the spatial period of variations caused by detector device gain.

As will be understood in view of the above explanations, however, in different embodiments, different types of first smoothing functions are used, and the low-pass filter is one such function type. Other smoothing techniques include a Savitzgy-Golay smoothing filter, Gaussian convolution, box car smoothing, or equivalent Fourier low-pass frequency filters, a moving average algorithm, and triangular and rectangular smoothing algorithms, and these are further examples that may be used.

It will be appreciated that the detector device gain variations in the obtained target image cause the values of the pixels of the target image to be multiplied by a gain factor, which may be represented by g(J), that varies typically across the image. Removing the contribution of the relative detector device gain from the value of a pixel of the target image therefore typically comprises dividing the value of the pixel of the target image by the value of the corresponding pixel of the gain variation image so as to obtain a value for the corresponding pixel of the gain variation-corrected image. In this way, the gain factors are divided out of the target image so as to produce an image in which the pixels are unaffected by gain variations arising from the detector device itself.

It is noted above that, for the purposes of the method described above, the dark fixed pattern noise present in acquired images may be assumed to have been removed or corrected for. Therefore, typically obtaining each of the calibration image and the target image further comprises removing dark signal non-uniformity from the respective image. Thus the contribution to each of the calibration and target images owing to dark signal non-uniformity is typically removed. In particular, this step typically comprises removing non-uniformity or variation in pixel values that are caused by imperfections in the detector device itself. This is generally understood as the offset from the average across the imaging array at a particular setting, for example temperature, integration time, but without external illumination, including illumination by electrons. The dark signal non-uniformity, represented by N(J), is typically measured in absence of illumination, and in this case in absence of electrons being incident upon the detector, so as to obtain N(J) values for each of the pixels. The dark signal non-uniformity is typically additive in its contribution to the pixel values of images acquired with a detector, and so can be removed by subtracting the dark signal non-uniformity pattern that is obtained in absence of illumination from obtained targets and calibration images.

In preferable embodiments, the first set of microscope conditions and the second set of microscope conditions are different. As noted above, the first set of microscope conditions may be thought of as calibration conditions, and the second set of microscope conditions may be considered as target conditions or specimen conditions.

It is envisaged, however, that in some embodiments, the first and second sets of microscope conditions are the same. In such embodiments, it may be considered that the selection or arrangement of one or both of the calibration and target specimens may not be part of the set of microscope conditions, and as such the calibration and target steps may differ at least by virtue of the type or arrangement of specimens used. For example, an amorphous sample may be used as the calibration specimen in the calibration step in order to achieve an image lacking a diffraction pattern. In embodiments wherein the selection of the specimens is included in the sets of conditions, it is in principle possible to use the same specimen as both the calibration specimen and the target specimen, but with other microscope conditions that are so different as to result in very poor diffraction contrast for calibration and optimal diffraction contrast for acquiring the target image.

In principle therefore, if the selection of specimens is not part of the conditions, or if appropriately different calibration and target specimens are used which, in themselves, cause the lack of a diffraction pattern in the calibration image and the presence of one in the target image, it is possible to use first and second microscope conditions that are otherwise identical. In particular, the same other conditions may be used for calibration, MC, and specimen, MS. However, because R(J) is typically a digital image acquired from an electronic system, there are potential noise and quantization errors at each pixel and the precision of g(J) is improved when R(J) takes large values. Under standard conditions for EBSD analysis (with a high specimen surface tilt and small detector distance) there may be large variations in diffuse background intensity, but if a non-standard geometry is used (with smaller specimen tilt and/or larger detector distance) there is less variation in R(J) over the image and it is preferable to use this configuration for calibration to achieve more uniform precision in the determination of relative pixel gain, g(J).

Furthermore, if the variation in diffuse background intensity over the whole image under conditions MC is much less than for conditions MS, the low-pass filter F1 can be arranged to suppress lower spatial frequencies more than filter F2, without distorting the estimate of the diffuse background intensity. Use of a more severe low-pass filter F1 is beneficial because it provides more effective suppression of detail due to variable pixel gain so that the estimate of relative pixel gain in step 3 of FIG. 4 is more accurate.

Most electrons that contribute to Kikuchi diffraction effects typically have energy close to the energy of the focused incident electron beam that strikes the specimen. The size and shape of the zone of interaction that produces light when an electron strikes a phosphor is affected by the energy of the incident electron. Thus, the signal response at individual pixels in the camera sensor is affected by the incident beam energy. Therefore, the relative pixel gain, g(J), at each pixel may vary with incident beam energy and it is preferable that a set of values for g(J) be obtained at the beam energy that is to be used for analysing the specimen. The change in g(J) caused by changes in beam keV are gradual so it is possible to obtain a set of values for g(J) at a particular beam energy by interpolating between sets of values for g(J) obtained by separate calibration at two or more different values of beam energy.

Once the relative pixel gain, g(J), has been determined for a particular incident beam energy, that can be used to correct images obtained in either EBSD or TKD configurations.

It is preferable, when obtaining the calibration image, to reduce the dynamic range in that image. The dynamic range may be understood as the ratio between maximum and minimum pixel values, or pixel intensities, in an image. Preferably, therefore, the first set of microscope conditions is configured so as to minimize the dynamic range of pixel values across the image. This may be achieved in particular by optimizing the geometry, preferably the relative orientations and positions, of the electron beam, the calibration specimen, and the detector device.

The minimizing of the dynamic range may comprise reducing to the smallest degree possible, or reducing to less than a predetermined threshold, the dynamic range of the image. Such conditions typically correspond to minimized angular variation in intensity of electrons imaged from the calibration sample. The optimizing the process so as to identify conditions that result in the dynamic range being minimized may involve adjusting the conditions, such as the geometry as noted above, until a minimum or a suitably low dynamic range is found, or it may be performed by adjusting the conditions according to a known relationship with or effect on the dynamic range. For example, an increased distance between the detector and the specimen, a reduced tilt angle between the beam axis and the specimen, or the normal vector of the specimen surface on which the beam impinges, would be understood to affect the dynamic range in a predictable manner.

It is possible to improve the accuracy of the removal of the gain variation pattern by way of performing the "calibration step" multiple times. Thus in some embodiments, the method further comprises: repeating at least once, the steps of obtaining, according to a respective further set of microscope conditions, a calibration image, and obtaining therefrom a gain variation image comprising a plurality of pixels, each having a value representing a calculated value for a relative detector device gain value for a corresponding pixel of the calibration image, so as to obtain at least one further gain variation image: obtaining more than one gain variation image may be beneficial in a number of applications. For instance, because of the above noted relationship between the relative pixel gain and incident electron beam energy for the beam impinging upon the specimen, it is preferable that the energy of the electron beam using which the calibration image, and therefore the gain variation image, are obtained is similar to, or more preferably the same as, the incident beam energy that is to be used for obtaining the target image. In light of this, obtaining multiple calibration images using different beam energies may be advantageous since doing so would allow an appropriate calibration image, and corresponding gain variation image derived therefrom to be selected in accordance with the beam energy comprised by the second set of microscope conditions with which the target image is obtained. Thus, in some embodiments where the obtaining of the calibration image and gain variation image are repeated, each of the first and further sets of microscope conditions comprises a different beam energy. In such cases, the gain variation-corrected image may be obtained by removing from the target image pixel values the contribution to the pixel values of the relative detector device gain in accordance with the corresponding pixel values of one of the first and further gain variation images that is selected in accordance with the microscope conditions under which the selected corresponding calibration image was obtained. In particular, the selection may be made based upon a similarity or calculated comparison between the second set of microscope conditions and the set of microscope conditions corresponding to the one of the first and further gain variation images that is selected. In particular, the comparison is preferably assessed based on the beam energy of the aforementioned sets of microscope conditions.

In some embodiments, the method further comprises combining the first and at least one further gain variation images to obtain a combined gain variation image, wherein the gain variation-corrected image is obtained in accordance with the combined gain variation image. In this way, the first, and one or more, gain variation images may be used in combination to achieve a combined gain variation image that may more accurately represent the relative detector device gain values effecting images acquired by that detector device. The combining may be performed, for example, by image averaging. For instance, for each pixel of the first gain variation image, the pixel value may be combined by way of an average, such as a mean or weighted mean, with the value of the corresponding pixel in each of the at least one further gain variation images.

The gain variation-corrected image may thus comprise, for each pixel of the target image, removing from the pixel value, in accordance with the value of the corresponding pixel of the combined gain variation image, the contribution to the pixel value of the relative detector device gain. It will be understood that, by repeating the calibration step, multiple measurements or estimates of the pixel gain variation are obtained, and so it will be expected that the calculated gain variation values may provide a more true or accurate representation of the gain variation contribution attributable to the detector device pixels.

The obtaining of the calibration image, as well as the obtaining of the gain variation image, may be performed separately, in the sense of being part of a separate procedure, from the obtaining of the target image and the subsequent obtaining of the gain variation-corrected image. Thus in some embodiments the "calibration step" for the detector device is performed independently of the acquiring of any target images using that detector device, and the information obtained during the calibration step, including the gain variation image itself, may be used to remove the gain variation contributions from any previously acquired or subsequently acquired target images. It will be understood in view of this that the gain variation correction procedure may be applied to any number of images acquired of target specimens using the detector device. Therefore, in some embodiments, the method further comprises: for each of one or more further target specimens, obtaining a respective further target image; and in accordance with the gain variation image, removing from each of the one or more further target images the contribution of the relative detector device gain so as to obtain one or more respective further gain variation-corrected images. Each further target specimen may be a separate piece of material from that of the first target specimen, or it may be a different region of the same piece of material. The obtaining a respective further target image for each of the further target specimens typically comprises repeating the step of obtaining a target image for each further target specimen.

The removing step typically comprises, for each further target image, for each pixel of the further target image, removing from the pixel value, in accordance with the value of the corresponding pixel of the gain variation image, the contribution to the pixel value of the relative detector device gain, so as to obtain a respective further gain variation-corrected image.

In some embodiments, the method is for diffraction pattern analysis in an electron microscope comprising an electron-sensitive digital camera, being or comprising the detector device, and a digital data processor, wherein in a calibration step a calibration specimen and a first set of microscope conditions is chosen to produce an image on the camera that does not include any electron diffraction pattern contrast and a digital image is recorded by the camera, the digital image is analysed by the data processor to determine the relative gain of individual pixels, the specimen to be analysed is exposed to the electron beam under a second set of microscope conditions that does produce an image on the camera that includes electron diffraction pattern contrast and a digital image is recorded by the camera, the intensity values for individual pixels are divided by the relative gain values determined for individual pixels from the calibration step.

According to a second aspect of the invention there is provided a system for processing a diffraction pattern image obtained in an electron microscope, the system comprising: a detector device configured to monitor electrons resulting from an electron beam of the electron microscope impinging upon a calibration specimen according to a first set of microscope conditions so as to obtain a calibration image comprising a plurality of pixels having values, the first set of microscope conditions being configured such that the calibration image includes substantially no electron diffraction pattern; and a digital data processor configured to obtain, from the calibration image, a gain variation image comprising a plurality of pixels, each having a value representing relative detector device gain for a corresponding pixel of the calibration image; the detector device being further configured to monitor electrons resulting from the electron beam impinging upon a target specimen according to a second set of microscope conditions so as to obtain a target image comprising a plurality of pixels having values, the second set of microscope conditions being configured such that the target image includes an electron diffraction pattern; and the digital data processor being further configured, for each pixel of the target image, to remove from the pixel value, in accordance with the value of the corresponding pixel of the gain variation image, the contribution to the pixel value of the relative detector device gain, so as to obtain a gain variation-corrected image.

The system may be used advantageously to obtain an image of a target specimen in which variations and pixel intensity due to detector device gain may be reduced or removed. Typically, the system comprises an electron-sensitive digital camera and a digital data processor.

The system may be applied to detector devices of different types, and as explained in the above background section, the problem of detector device gain variations is suffered in various types of equipment.

One type of detector device with which use of the disclosed system is particularly advantageous is an EBSD detector.

In some embodiments, the detector device comprises a phosphor-coated fibre-optic bundle comprising a plurality of optical fibres. A fibre-optic bundle typically comprises a close-packed array of optical fibres. These fibre-optic bundles are typically suitable for use, instead of a lens, in coupling light between two locations and maintaining an optical image. As is well known in the art, a phosphor typically refers to a fluorescent or phosphorescent substance, or a luminescent substance. The phosphor is typically in the form of a powdered material. Moreover, the phosphor is typically a synthetic material. An optical fibre, or a fibre optic, is typically understood to be a thin, flexible fibre through which light or optical signals can be transmitted, typically with very little loss.

Such an arrangement involving a phosphor-coated optical fibre bundle is typically included in CMOS devices. In this disclosure, the term "phosphor-coated" refers to a surface at an end of an optical fibre or an optical fibre bundle being coated with a phosphor. In this way a variation on the previously described device is envisaged, wherein a single-crystal scintillator is bonded to the top face of the bundle of optical fibres rather than a coating of powdered phosphor being disposed there upon. Accordingly, in some embodiments, the detector device comprises a CMOS image sensor. As is well known in the art, this refers to a complimentary metal-oxide-semiconductor device. The device typically comprises an active pixel sensor, where each pixel comprises a photo detector and an active amplifier.

A further type of system in which the removal of pixel gain variations is advantageous involves a different form of electron-sensitive detector. In some embodiments, the detector device comprises a scintillator. This is typically understood to be a material that fluoresces when struck by a charged particle such as the resulting electrons in the context of this disclosure, or a high-energy photon. The detector device of the system may typically comprise a single-crystal luminescent material.

In some embodiments, the detector device comprises a scintillator coupled to or bonded with an optical fibre bundle.

A further type of device that may be used advantageously in the presently disclosed system is a direct electron detector, as referenced in the above background section. A direct electron detector, or a direct detection device, is commonly in the form of a camera that senses by means other than phosphors or scintillators. Such devices typically comprise a layer through which incident electrons pass through so as to leave an ionization trail that is collected and either integrated or counted in pixels. This device may also, like the aforementioned device types, suffer from image artefacts owing to pixel gain variations, which the present system seeks to correct.

There is also provided an electron microscope comprising a system according to the second aspect. Thus the electron microscope may be used to obtain microscopy images such as EBSD images of target specimens while mitigating or removing the patterns or image components that would otherwise arise from variations in gain across pixels of the detector device.

BRIEF DESCRIPTION OF THE DRAWINGS

Examples of the present invention will now be described, with reference to the accompanying drawings, in which.

DESCRIPTION OF EMBODIMENTS

Figure 1:
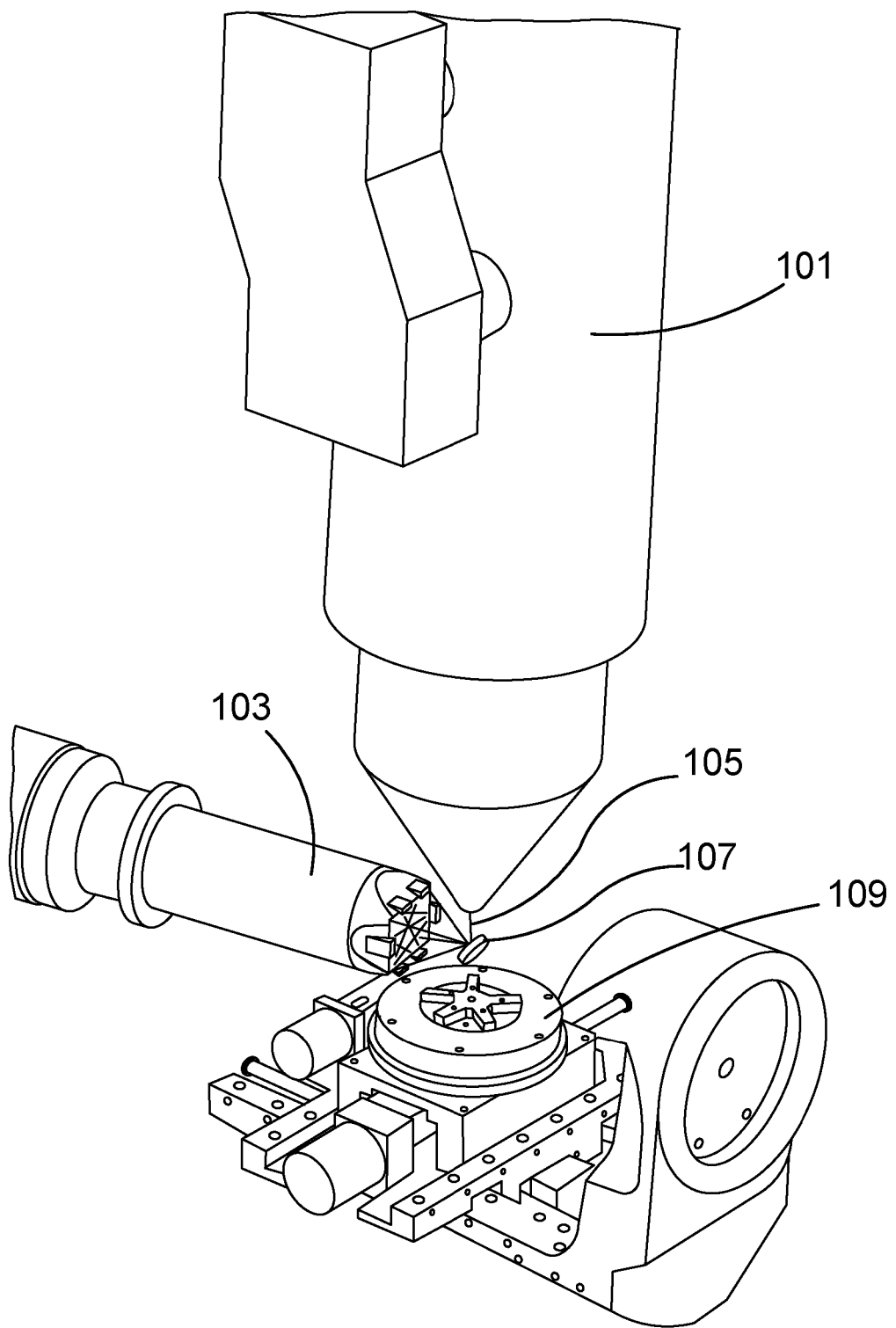
FIG. 1 is a perspective view schematically showing an EBSD detection system in a scanning electron microscope (SEM)
Figure 2:
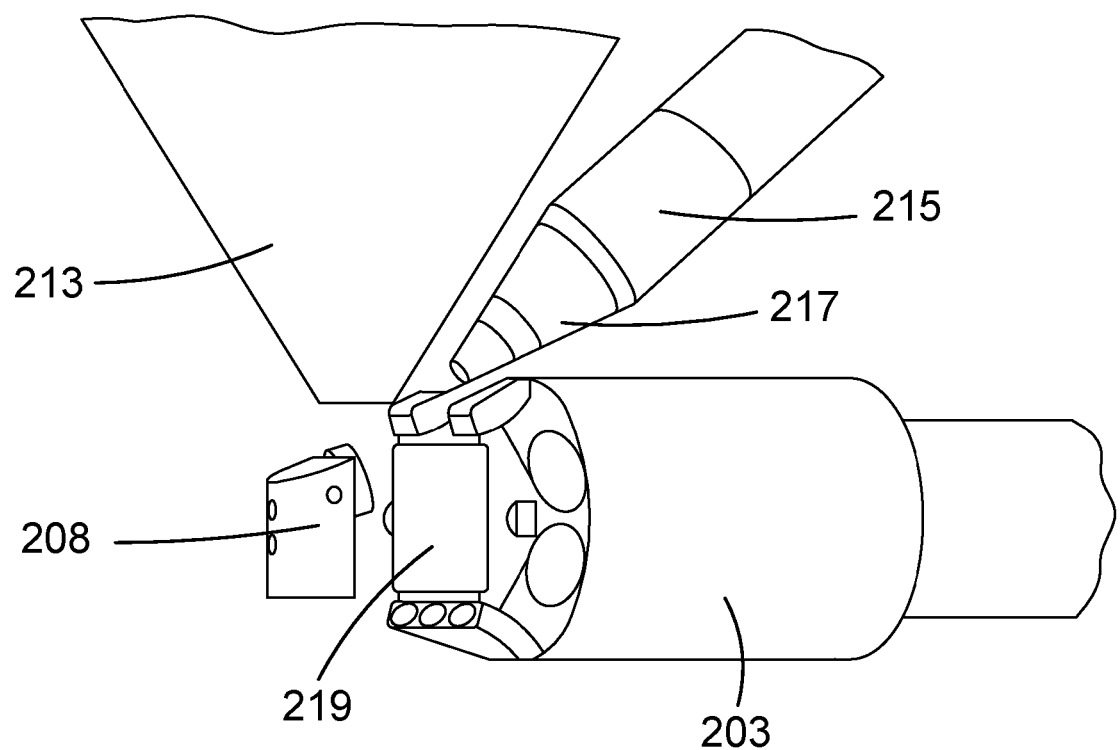
FIG. 2 is a perspective view schematically showing a typical arrangement for detection of EBSD patterns.
Figure 5:
FIG. 5 is an example EBSD pattern obtained with a conventional EBSD camera.

When an image is recorded from scattered electrons using a typical geometry as shown in FIG. 2 with the specimen tilted 70 degrees so that the incident beam makes an angle of 20 degrees with the surface, a typical camera system that uses a phosphor, conventional optical lenses and a charge coupled device (CCD) image sensor will record an image resembling that shown in FIG. 5.

Figure 6:
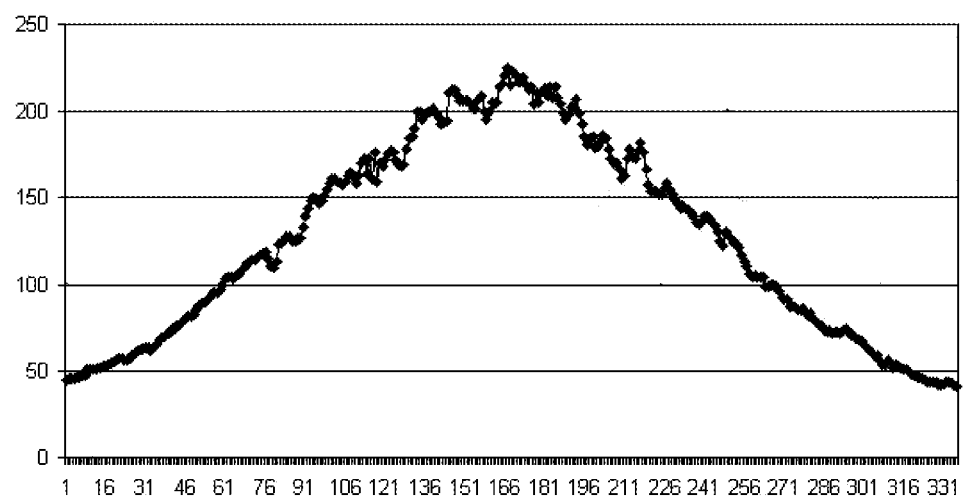
FIG. 6 is a graph showing the intensity profile showing pixel values along a line halfway vertically down and running horizontally across the pattern of FIG. 5.

The image intensity varies considerably across the field of view and the weak Kikuchi diffraction lines are seen as a modulation of the background due to diffusely scattered electrons. This is apparent in the intensity profile in FIG. 6 that shows intensity values along a line across the middle of the image where the diffraction contrast is seen as a high frequency ripple on top of a slowly varying background. If this profile is smoothed using a digital convolution filter where the support of the filter is much wider than the period of oscillation of the diffraction detail and typically more than 10% of the field width, the high frequency detail is averaged out.

Well-known smoothing techniques such as Savitzgy-Golay fit, Gaussian convolution or box car smoothing can be used, or the equivalent Fourier low-pass frequency filter can be used to de-emphasise the high frequency detail. The smoothing can be applied to all horizontal lines in the image and then to all vertical lines, or a 2D version of the low-pass filter or the equivalent convolution can be applied to the whole 2D image, as suggested by Dingley et al., for example.

Figure 7:
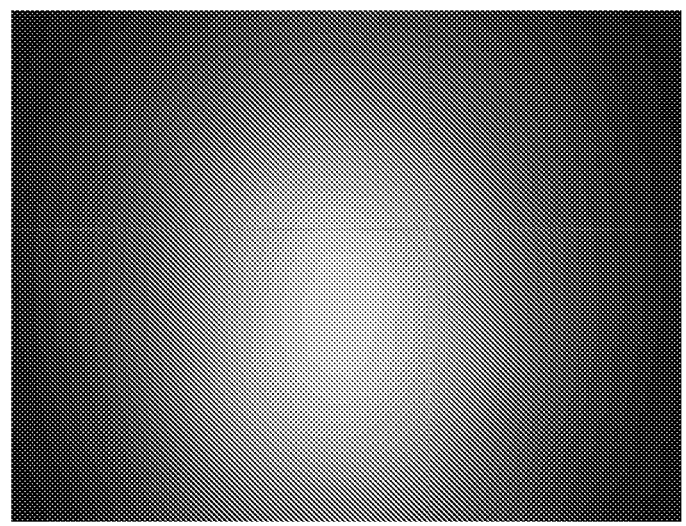
FIG. 7 shows the image of FIG. 5 after the application of a low-pass filter.
Figure 8:
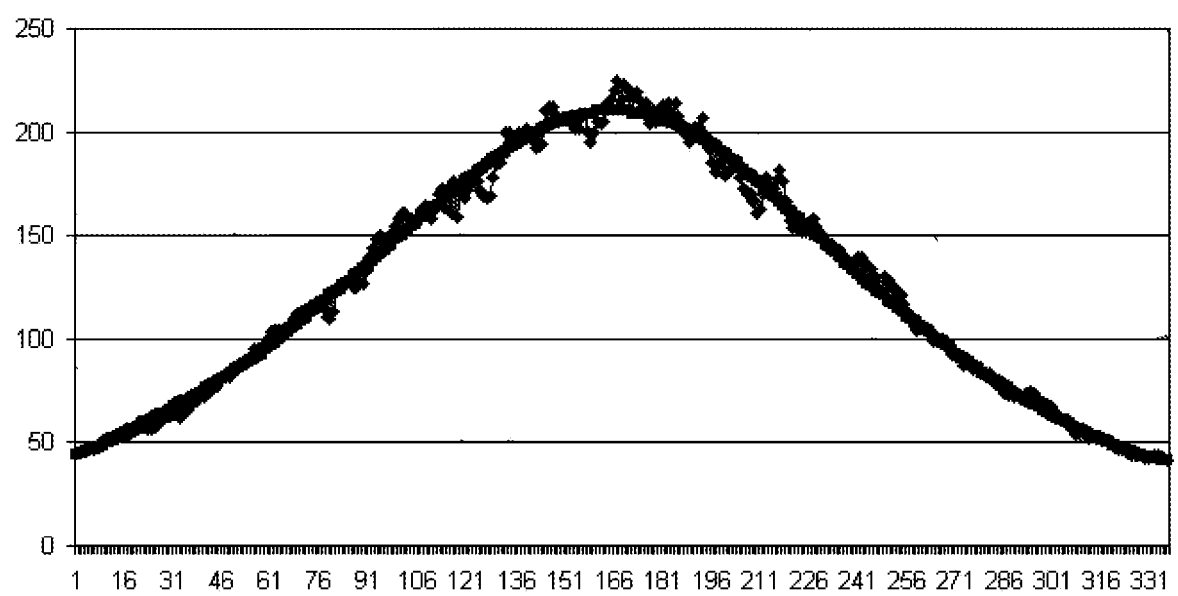
FIG. 8 shows the intensity profile from FIG. 6 with the pixel values along the corresponding line applied to FIG. 7 overlaid.
Figure 9:
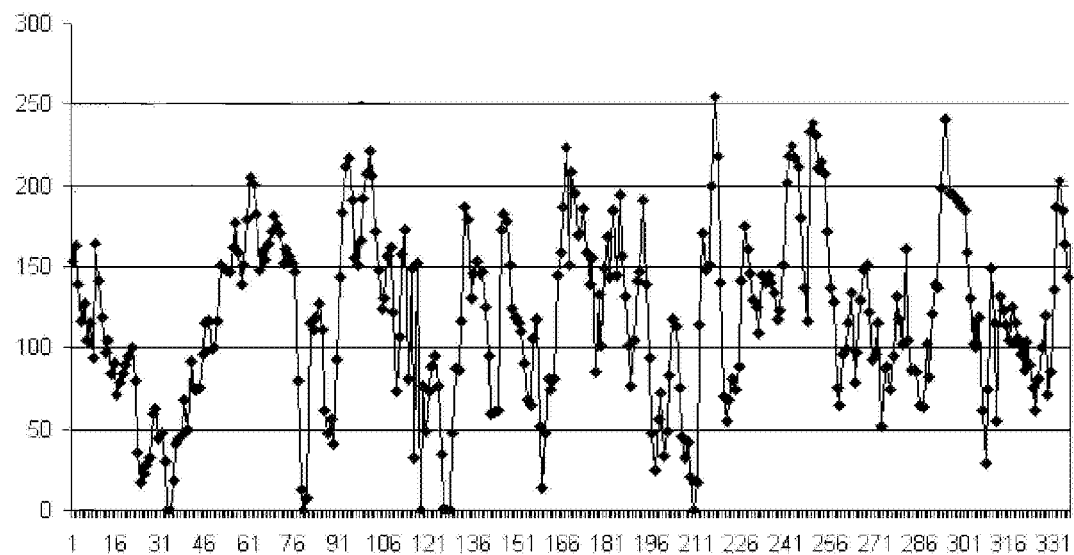
FIG. 9 is a graph showing the ratio between the original and low-pass filtered intensity profiles from FIG. 8, offset and amplified to show the high-frequency modulation due to diffraction contrast.
Figure 10:
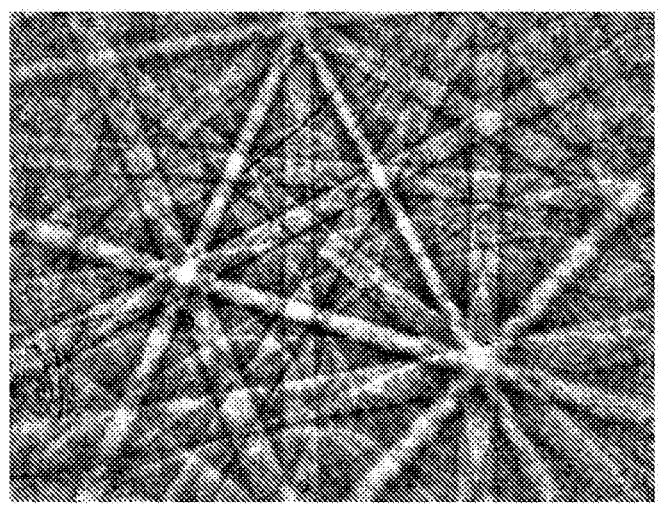
FIG. 10 shows the full image corresponding to the intensity profile of FIG. 9 exhibiting enhanced Kikuchi diffraction contrast after applying dynamic background correction to the image in FIG. 5.

The result of processing the image in FIG. 5 with such a filter is shown in FIG. 7, wherein only the low-frequency diffuse background is now apparent. The intensity profiles from FIGS. 5 and 7 are superimposed in FIG. 8. When the original intensity profile is divided by the smoothed (in this case, low-pass filtered) profile and suitably scaled and offset, the resulting image depicted in FIG. 9 shows the modulation due to diffraction contrast much more clearly. When this operation is performed over the whole image, the result, shown in FIG. 10, illustrates how "dynamic background correction" provides a strong enhancement of the Kikuchi pattern contrast. It is evident, however, that even with this conventional camera system, there are still localised screen "defects" and high spatial frequency phosphor "grain" contrast that remain visible after conventional dynamic background correction.

Figure 3:
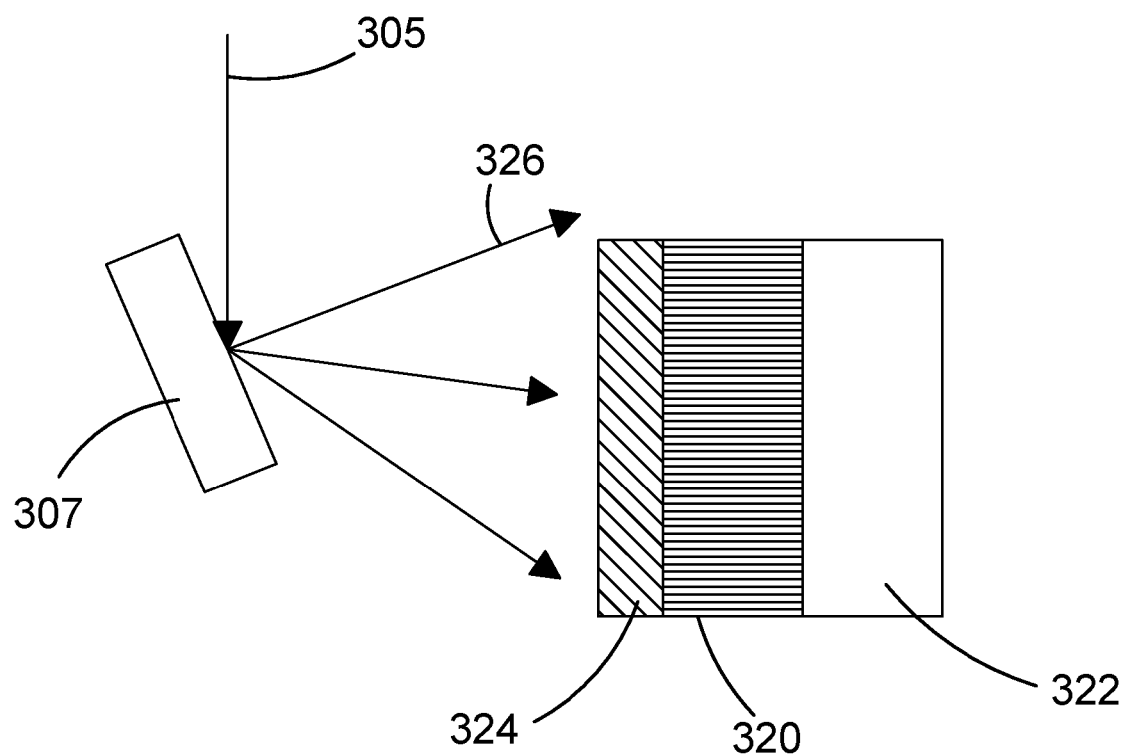
FIG. 3 is a schematic diagram showing components of an electron-sensitive camera with optical coupling via a fibre-optic imaging bundle.
Figure 4:
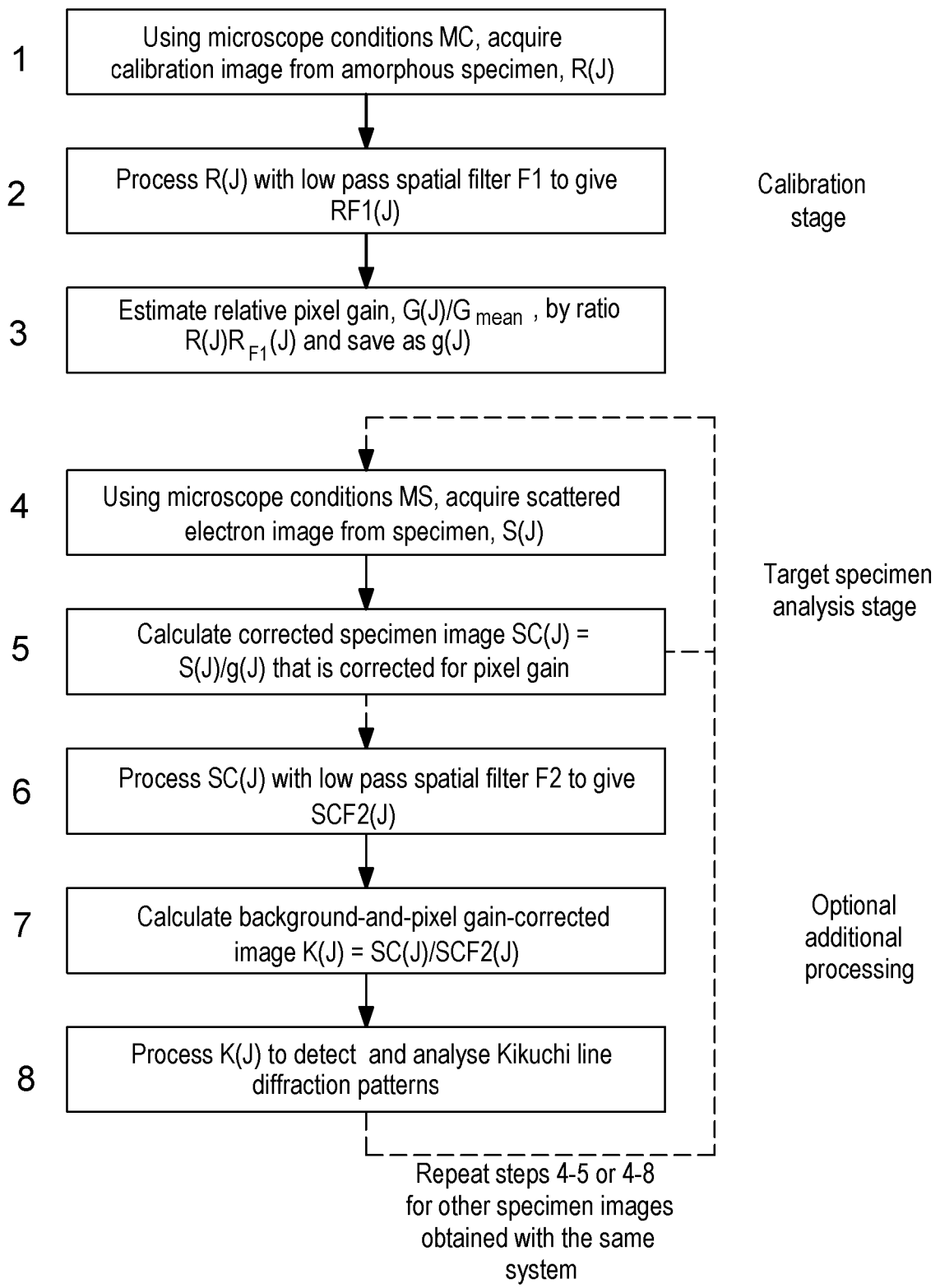
FIG. 4 is a flow chart showing operations involved in an embodiment of the invention on a pixel with reference index J.
Figure 11:
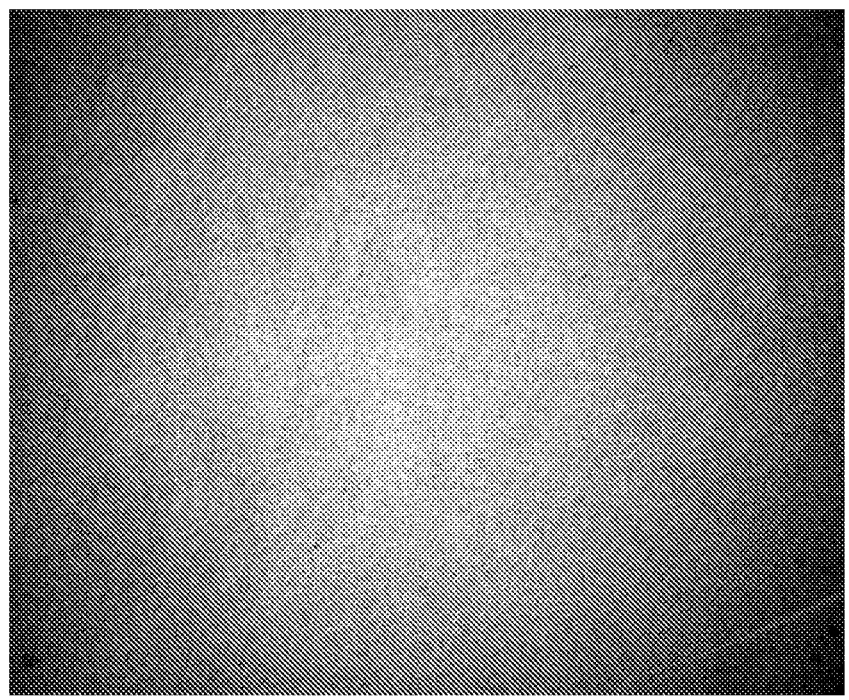
FIG. 11 is a calibration image obtained in an example method according to the invention, and is a scattered electron image from an amorphous brass calibration specimen showing a high-frequency pattern due to pixel gain variations.

In a first example method according to the invention, a camera system is used similar to that shown in FIG. 3, where the digital camera uses a CMOS image sensor. All images obtained by the camera are corrected for dark fixed pattern noise. The inventors have discovered that, despite this correction, images show artefacts due to there being a variable effective gain at each pixel position. Furthermore, it was found that the nature of the variation was different if the camera was illuminated with light (visible or UV) or with electrons, and is also different depending upon the energy of electrons striking the phosphor. To determine the relative pixel gain that would be relevant for specimen analysis, a scattered electron image, that is recorded from an amorphous brass specimen where the surface makes an angle of 40 degrees with the incident electron beam. The camera is retracted to a point where the maximum of the background due to diffusely-scattered electrons is approximately at the centre of the image and an example of the image acquired is shown in FIG. 11. Although there is no diffraction contrast with an amorphous specimen, FIG. 11 shows that there is a lot of high-frequency detail in the image that is caused by pixel gain variation that modulates the background owing to diffusely-scattered electrons.

Figure 12:
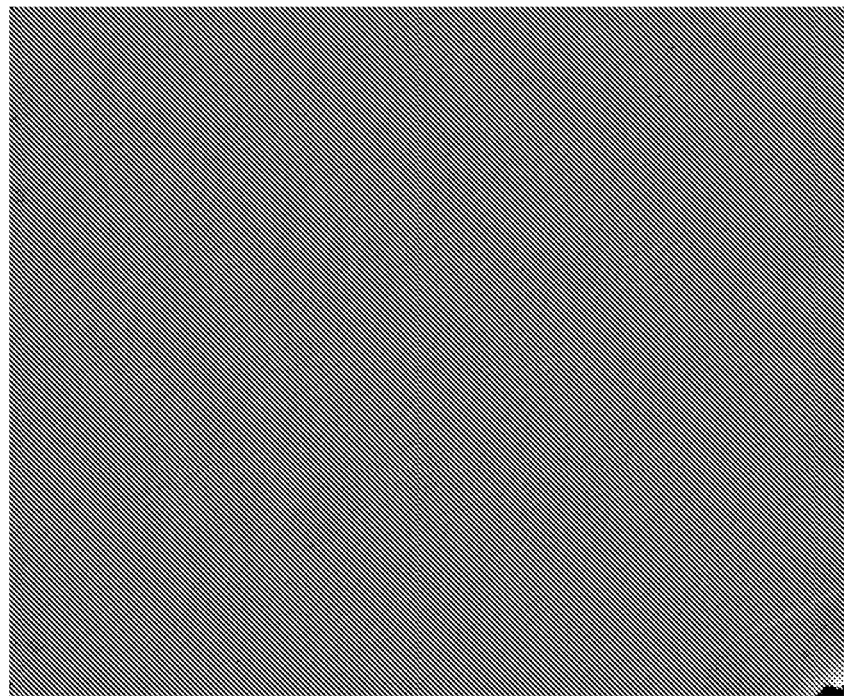
FIG. 12 is a gain variation image according to the example method of the invention and obtained from the calibration image of FIG. 11.

The calibration image is low-pass filtered using the same approach as for "dynamic background correction", but the range of the equivalent smoothing operation can be typically a factor of two greater because the dynamic range of the diffuse background has been reduced by using an optimised geometry for the pixel gain calibration procedure. This operation effectively removes the high-frequency fluctuations due to pixel gain variation. When the calibration image is divided by the low-pass filtered image, a gain variation image is obtained where each pixel is proportional to the pixel gain, as shown in FIG. 12. This procedure is typically repeated at a few beam energies that cover the range of beam energies likely to be used for analysing specimens (e.g. 30 keV, 20 keV, 10 keV, and 5 keV), and the gain variation images representing relative pixel gain, g(J), are stored for each energy.

When a target specimen is to be analysed, it is set up in the recommended geometry (e.g. for EBSD, 70 degree tilt of surface, for TKD a few degrees tilt) and when the SEM beam energy is selected, the appropriate g(J) is retrieved from storage, and if there is no calibration of g(J) available at the exact beam energy, then g(J) at each pixel is obtained by interpolation between values for g(J) images stored at other keV values.

Figure 13:
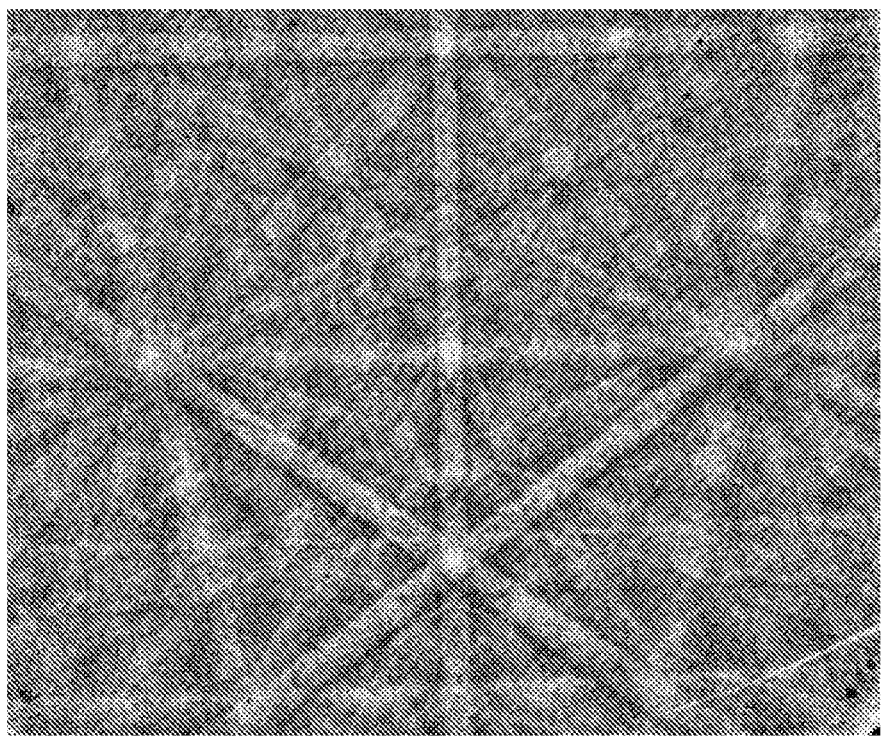
FIG. 13 is a scattered electron image obtained from the specimen after the application of dynamic background correction.
Figure 14:
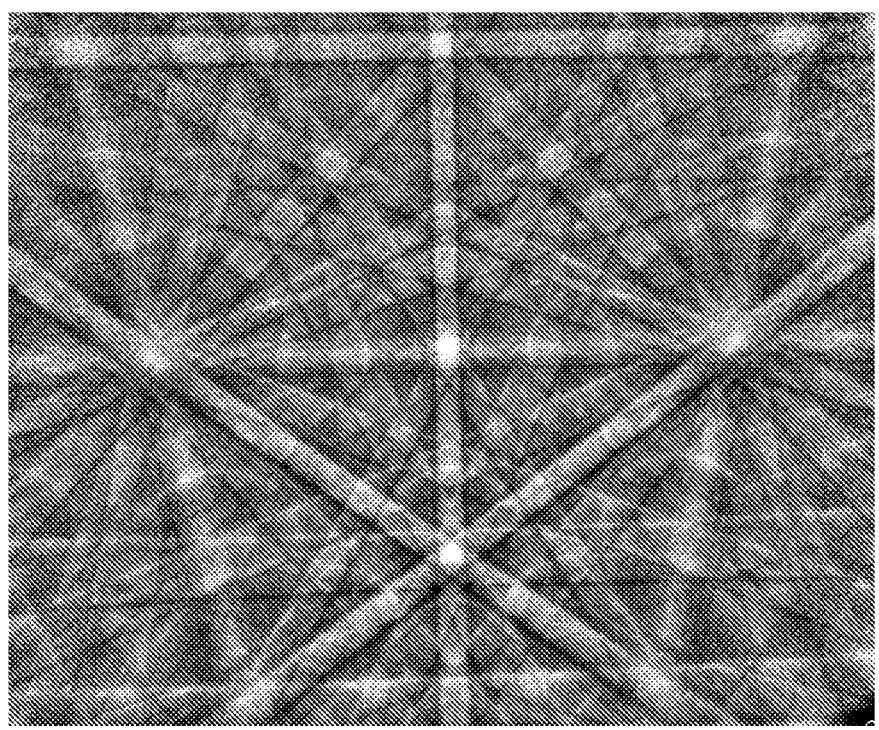
FIG. 14 shows a gain variation-corrected image obtained in the example method according to the invention and corresponding to the image of FIG. 13, after the application of pixel gain correction prior to dynamic background correction.

FIG. 13 shows an example of a scattered electron image acquired with a 20 keV incident beam after conventional dynamic background correction. It is apparent that artefacts due to camera system pixel gain variation are interfering with the diffraction contrast. However, when the original image is divided by the relative pixel gain, g(J), appropriate for 20 keV, so as to obtain a gain variation-corrected image, and then dynamic background correction applied to this image, the result in FIG. 14 exhibits a diffraction contrast that is much clearer, and further analysis to identify crystallographic properties is thus greatly improved.

The invention claimed is:

1. A method of processing a diffraction pattern image obtained in an electron microscope, the method comprising:
according to a first set of microscope conditions, causing an electron beam to impinge upon a calibration specimen so as to cause resulting electrons to be emitted therefrom and monitoring the resulting electrons using a detector device so as to obtain a calibration image comprising a plurality of pixels having values, the first set of microscope conditions being configured such that the calibration image includes substantially no electron diffraction pattern;
obtaining, from the calibration image, a gain variation image comprising a plurality of pixels, each having a value representing relative detector device gain for a corresponding pixel of the calibration image;
according to a second set of microscope conditions, causing an electron beam to impinge upon a target specimen so as to cause resulting electrons to be emitted therefrom and monitoring the resulting electrons using the detector device so as to obtain a target image comprising a plurality of pixels having values, the second set of microscope conditions being configured such that the target image includes an electron diffraction pattern; and
for each pixel of the target image, removing from the pixel value, in accordance with the value of the corresponding pixel of the gain variation image, the contribution to the pixel value of the relative detector device gain, so as to obtain a gain variation-corrected image.

2. A method according to claim 1, wherein obtaining the value of each pixel of the gain variation image comprises calculating an estimate of the relative detector device gain for a corresponding pixel of the calibration image.

3. A method according to claim 2, wherein obtaining the gain variation image comprises:
applying a first smoothing function to the calibration image so as to obtain a first smoothed image comprising a plurality of pixels corresponding to the plurality of pixels of the calibration image, and
for each pixel of the calibration image, dividing the pixel value by the value of the corresponding pixel of the first smoothed image so as to obtain a calculated value for the relative detector device gain for the pixel.

4. A method according to claim 1, wherein obtaining the gain variation image comprises:
applying a first smoothing function to the calibration image so as to obtain a first smoothed image comprising a plurality of pixels corresponding to the plurality of pixels of the calibration image, and for each pixel of the calibration image, dividing the pixel value by the value of the corresponding pixel of the first smoothed image so as to obtain a calculated value for the relative detector device gain for the pixel.

5. A method according to claim 4, wherein the first smoothing function is a first low-pass spatial filter, and the first smoothed image is a first filtered image.

6. A method according to claim 1, wherein removing the contribution of the relative detector device gain from the value of a pixel of the target image comprises dividing the value of the pixel of the target image by the value of the corresponding pixel of the gain variation image so as to obtain a value for the corresponding pixel of the gain variation-corrected image.

7. A method according to claim 1, wherein obtaining each of the calibration image and the target image further comprises removing dark signal non-uniformity from the respective image.

8. A method according to claim 1, wherein the first set of microscope conditions and the second set of microscope conditions are different.

9. A method according to claim 8, wherein the first set of microscope conditions is configured so as to minimize the dynamic range of pixel values across the image.

10. A method according to claim 1, wherein the method further comprises:
repeating, at least once, the steps of obtaining, according to a respective further set of microscope conditions, a calibration image, and obtaining therefrom a gain variation image comprising a plurality of pixels, each having a value representing a calculated value for a relative detector device gain value for a corresponding pixel of the calibration image, so as to obtain at least one further gain variation image.

11. A method according to claim 10, wherein each of the first and further sets of microscope conditions comprises a different beam energy.

12. A method according to claim 10, further comprising combining the first and at least one further gain variation images to obtain a combined gain variation image,
wherein the gain variation-corrected image is obtained in accordance with the combined gain variation image.

13. A method according to claim 1, wherein the method further comprises:
for each of one or more further target specimens, obtaining a respective further target image; and
in accordance with the gain variation image, removing from each of the one or more further target images the contribution of the relative detector device gain so as to obtain one or more respective further gain variation-corrected images.

14. A method, according to claim 1, for diffraction pattern analysis in an electron microscope comprising an electron-sensitive digital camera and a digital data processor,
wherein in a calibration step a calibration specimen and a first set of microscope conditions is chosen to produce an image on the camera that does not include any electron diffraction pattern contrast and a digital image is recorded by the camera,
the digital image is analysed by the data processor to determine the relative gain of individual pixels,
the specimen to be analysed is exposed to the electron beam under a second set of microscope conditions that does produce an image on the camera that includes electron diffraction pattern contrast and a digital image is recorded by the camera,
the intensity values for individual pixels are divided by the relative gain values determined for individual pixels from the calibration step.

15. A system for processing a diffraction pattern image obtained in an electron microscope, the system comprising:
a detector device configured to monitor electrons resulting from an electron beam of the electron microscope impinging upon a calibration specimen according to a first set of microscope conditions so as to obtain a calibration image comprising a plurality of pixels having values, the first set of microscope conditions being configured such that the calibration image includes substantially no electron diffraction pattern; and
a digital data processor configured to obtain, from the calibration image, a gain variation image comprising a plurality of pixels, each having a value representing relative detector device gain for a corresponding pixel of the calibration image;
the detector device being further configured to monitor electrons resulting from the electron beam impinging upon a target specimen according to a second set of microscope conditions so as to obtain a target image comprising a plurality of pixels having values, the second set of microscope conditions being configured such that the target image includes an electron diffraction pattern; and
the digital data processor being further configured, for each pixel of the target image, to remove from the pixel value, in accordance with the value of the corresponding pixel of the gain variation image, the contribution to the pixel value of the relative detector device gain, so as to obtain a gain variation-corrected image.

16. A system according to claim 15, wherein the detector device comprises a phosphor-coated fibre-optic bundle comprising a plurality of optical fibres.

17. A system according to claim 15, wherein the detector device comprises a CMOS image sensor.

18. A system according to claim 15, wherein the detector device comprises a scintillator.

19. A system according to claim 15, wherein the detector device comprises a direct electron detector.

* * * * *